United States Patent
Couvert et al.

(10) Patent No.: US 6,460,171 B1
(45) Date of Patent: Oct. 1, 2002

(54) METHOD FOR DESIGNING A PROCESSOR CORE IN WHICH A CELL CONFIGURED AT EITHER ONE OR ZERO IS PROVIDED FOR EACH BIT OF THE CONFIGURATION REGISTERS OF THE PROCESSOR CORE

(75) Inventors: Patrice Couvert, Saint Marcellin; Patrick Correard, Poisat; Mona Lallement, Saint Egreve, all of (FR)

(73) Assignee: STMicroelectronics S.A., Gentilly (FR)

( * ) Notice: Subject to any disclaimer, the term of this patent is extended or adjusted under 35 U.S.C. 154(b) by 0 days.

(21) Appl. No.: 09/467,456

(22) Filed: Dec. 20, 1999

(30) Foreign Application Priority Data

Dec. 22, 1998 (FR) .............................................. 98 16217

(51) Int. Cl.$^7$ .............................................. G06F 17/50
(52) U.S. Cl. ................................. 716/16; 716/1; 716/12
(58) Field of Search ............................. 716/1, 2, 5, 42, 716/16

(56) References Cited

U.S. PATENT DOCUMENTS

| | | | | |
|---|---|---|---|---|
| 5,303,350 | A | | 4/1994 | Yu et al. ...................... 395/275 |
| 5,452,467 | A | * | 9/1995 | May et al. ...................... 716/1 |
| 5,635,855 | A | * | 6/1997 | Tang ............................ 716/12 |
| 5,777,885 | A | * | 7/1998 | Ehlig ............................ 716/1 |
| 6,272,465 | B1 | * | 8/2001 | Hewitt ........................ 704/258 |

FOREIGN PATENT DOCUMENTS

WO     WO97/13209     4/1997

OTHER PUBLICATIONS

Buchenrieder, K. et al. "Mapping Statechart Models onto an FGPA–based ASIP Architecture", Proceedings of EURO–DAC 1996: European Design Automation Conference, Geneva, Sep. 1996, XP000729864, pp. 184–189.

Sato, J. et al. "PEAS–I: A Hardware/Software Codesign System for ASIP Development", IEICE Transactions on Fundamentals of Electronics, Communications and Computer Sciences, vol. E77–A, No. 3, Mar. 1, 1994, XP000450885, pp. 483–491.

Liem C., et al. "Register Assignment Through Resource Classification fora ASIP Microcode Generation", IEEE/ACM International Conference on Computer –Aided Design, San Jose, Nov. 6, 1994, XP000529852, pp. 397–402.

French Search Report dated Oct. 7, 1999 with Annex to French Application No. 98 16217.

* cited by examiner

*Primary Examiner*—Vuthe Siek
*Assistant Examiner*—Thuan Do
(74) *Attorney, Agent, or Firm*—Lisa K. Jorgenson; Stephen Bongini; Fleit, Kain, Gibbons, Gutman & Bongini P.L.

(57) ABSTRACT

A method for designing a processor core is provided. Configuration registers are programmed by providing a cell configured at either one or zero for each bit of the configuration registers. Each configured cell is a latch with a data input and control signal inputs for receiving a direct resetting command and a direct setting command, and is configured at either one or zero by inhibiting either the direct resetting command or the direct setting command. Further, writing into the cells is permitted only in a test mode. Also provided is a method for designing and programming a processor core of the type having configuration registers. According to this method, a non-programmed processor core is designed by providing one vacant cell for each bit of the configuration registers. The vacant cell has the same abstract as both cells configured at one and cells configured at zero. The processor core is programmed by instantiating the non-programmed core, instantiating a programming block having a cell configured at either one or zero for each bit of the configuration registers, and superimposing each of the configured cells of the programming clock on the location of a corresponding vacant cell in the non-programmed core.

14 Claims, 4 Drawing Sheets

METHOD FOR DESIGNING A PROCESSOR CORE IN WHICH A CELL CONFIGURED AT EITHER ONE OR ZERO IS PROVIDED FOR EACH BIT OF THE CONFIGURATION REGISTERS OF THE PROCESSOR CORE

CROSS-REFERENCE TO RELATED APPLICATIONS

This application is based upon and claims priority from prior French Patent Application No. 98-16217, filed Dec. 22, 1998, the entire disclosure of which is herein incorporated by reference.

BACKGROUND OF THE INVENTION

1. Field of the Invention

The present invention relates to computer systems, and more specifically to a method for computed-assisted design of a processor core.

2. Description of Related Art

A processor core (or microprocessor core) is a set of resources that performs vital processor functions, and chiefly includes an instruction decoder, control circuits to manage an instruction register, an arithmetic and logic unit, a program counter containing the current address of the program, and the like. In general, a certain number of optional peripheral resources for the processor are proposed to make it possible to meet the specific needs of users. For example, possible peripheral resources include a digital-to-analog converter, a counter, and the like.

Furthermore, from one application to another, these resources may be configured at different physical addresses in the address space of the processor (which is defined by the width of the address and data busses) and with different access modes depending on the needs of the users. The processor core must know the physical addresses of the different peripheral resources of the processor in the address space of the processor, as well as their mode of access (typically the 8-bit multiplex mode or the 16-bit demultiplex mode), and this must be known as soon as the resetting signal ends. For this purpose, configuration registers are normally provided in order to contain the physical addresses of these resources and their corresponding mode of access. The programming of these configuration registers is obtained by wiring each of the bits of these registers either to 1 (by connecting the bit to VDD) or to 0 (by connecting the bit to ground).

FIGS. 1 and 2 show conventional processor cores. In the processor of FIG. 1, the configuration registers such as register R1$e$ are physically outside the core. In this case, it is necessary to raise each bit b1 to bn of the registers up to the corresponding decoding block DEC in the core. Thus, an input pin is planned for each bit of the configuration registers in the layout diagram of the core. In the example, there are pins s1 to sn. In the processor of FIG. 2, the configuration registers such as register R1$i$ are provided within the core itself. In both cases, this programming is permanent and definitive. The corresponding decoding block therefore cannot be tested in the core except with the definitive values taken by the bits of the configuration registers. This means that it is impossible to provide for complete coverage of the testing of the block.

Furthermore, with the configuration method shown in FIG. 1, it may be necessary to provide many input pins in the layout diagram of the core, depending on the number of resources made available to the choice of the user (i.e., the number of bits needed to encode all the physical addresses and the corresponding access modes). This leads to an increase in the dimensions of the core of the processor. As a tradeoff for providing this number of input pins, the positioning of these registers outside the core makes it possible to have only one core meeting the needs of all the applications (i.e., all the possible core and resource combinations).

With the configuration method shown in FIG. 2, there are no input pins to be planned but the core is then dedicated to one type of application. To each different application, there corresponds a new core. It is furthermore necessary to plan for a different core to make the corresponding emulator. Indeed, it is necessary in the emulator to be able to configure any address or any resource access mode. It is therefore necessary to plan input pins for the configuration bits as in FIG. 1 and external registers to drive the configuration bits.

SUMMARY OF THE INVENTION

In view of these drawbacks, it is an object of the present invention to overcome the above-mentioned drawbacks and to provide testability of the decoding block in a processor core while ensuring the irreversibility of the programming of the configuration registers.

Another object of the present invention is to provide a complete coverage of the testing of the decoding block of a processor core, with all of the possible values in the configuration registers.

Yet another object of the present invention is to provide a method for designing a processor core that enables the maintaining of a single processor core that is the same for the entire family, including the emulator.

One embodiment of the present invention provides a method for designing a processor core. According to the method, configuration registers are programmed by providing a cell configured at either one or zero for each bit of the configuration registers. Each configured cell is a latch with a data input and control signal inputs for receiving a direct resetting command and a direct setting command, and is configured at either one or zero by inhibiting either the direct resetting command or the direct setting command. Further, writing into the cells is permitted only in a test mode. In a preferred embodiment, both the cells configured at one and at zero have the same abstract defining their space requirements and input and output pins.

Another embodiment of the present invention provides a method for designing and programming a processor core of the type having configuration registers. According to the method, a non-programmed processor core is designed by providing one vacant cell for each bit of the configuration registers. The vacant cell has the same abstract as both cells configured at one and cells configured at zero. The processor core is programmed by instantiating the non-programmed core, instantiating a programming block having a cell configured at either one or zero for each bit of the configuration registers, and superimposing each of the configured cells of the programming clock on the location of a corresponding vacant cell in the non-programmed core. In one preferred method, each configured cell is a latch with a data input and control signal inputs for receiving a direct resetting command and a direct setting command, and is configured at either one or zero by inhibiting either the direct resetting command or the direct setting command.

Other objects, features, and advantages of the present invention will become apparent from the following detailed description. It should be understood, however, that the

DETAILED DESCRIPTION OF PREFERRED EMBODIMENTS

Preferred embodiments of the present invention will be described in detail hereinbelow with reference to the attached drawings.

According to a preferred embodiment of the present invention, D latch-type cells are used, and the configuration of such a cell at one or zero is respectively obtained by inhibiting the resetting command and the setting command in the cell. The testability is provided using the latch loading command in combination with the data input D of the cell, with this loading command being usable only in the test mode. Further, the cells (whether configured at one or zero) have an identical abstract (i.e., they have a reserved location of the same size in a layout diagram with the same input and output pins). Thus, a cell of this kind can be placed in a layout diagram without any problems of space or having an interface that differs depending on whether it is configured at 1 or at 0.

The core obtained according to such a design method is a programmed core specific to an application. A variant of the method makes it possible to initially obtain a non-programmed core that is instantiated (in the design tool) for each new application in order to program it. This method for designing the core uses a vacant or blank cell defined with the same abstract as a configured cell but empty of transistors. In other words, the corresponding layout diagram contains only the input and output pins and the corresponding levels of metal. This enables the design tool to place the abstract in the layout diagram of the core, reserve the necessary place for it, and route the necessary signals up to the periphery of this vacant cell. Therefore, it is possible to design the layout diagram of the core without programming it (i.e., by placing a vacant cell for each bit of the configuration registers).

At each new application, it is then enough to instantiate the non-programmed core, instantiate a programming block that may be seen as a peripheral resource of the core and that contains (for each bit of the configuration registers) a cell configured at 1 or 0 as a function of the application considered, and replace each vacant cell in the layout diagram of the core by a corresponding configured cell of the programming block. Finally, a programmed core is recovered. This programmed core results from the combination of the vacant core and the programming block. Thus, there is a vacant cell, a cell programmed at 1, and a cell programmed at 0 that are all the elements of the library of the designing tool.

Figure 1:
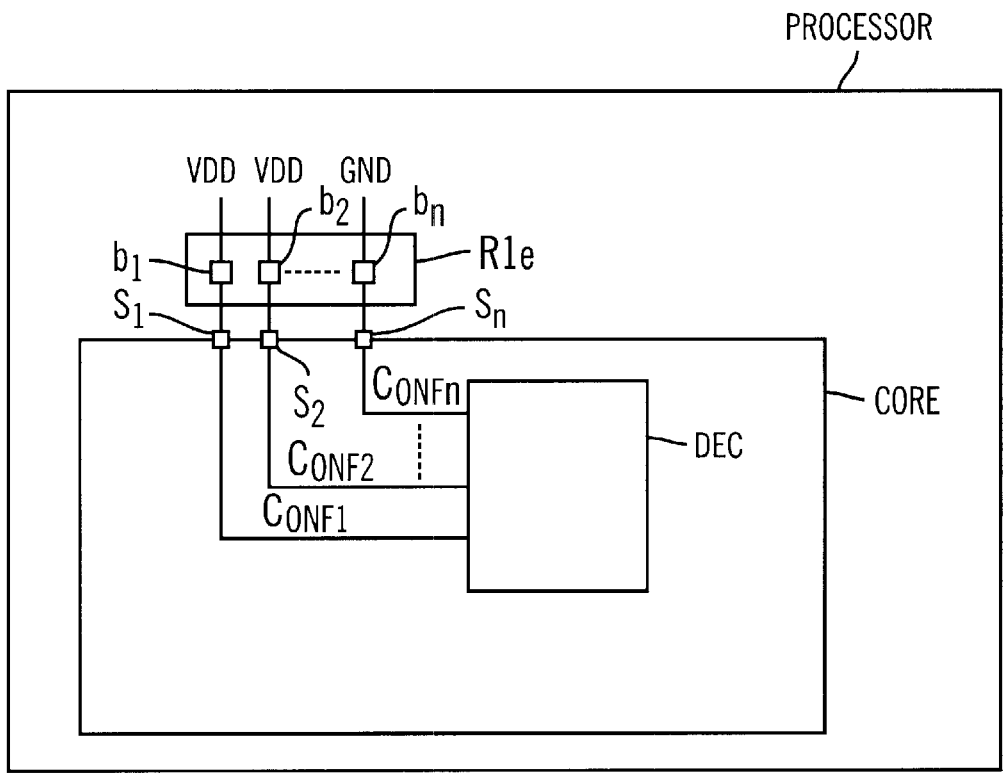
FIG. 1 is a block diagram of a processor having a conventional core configuration.
Figure 2:
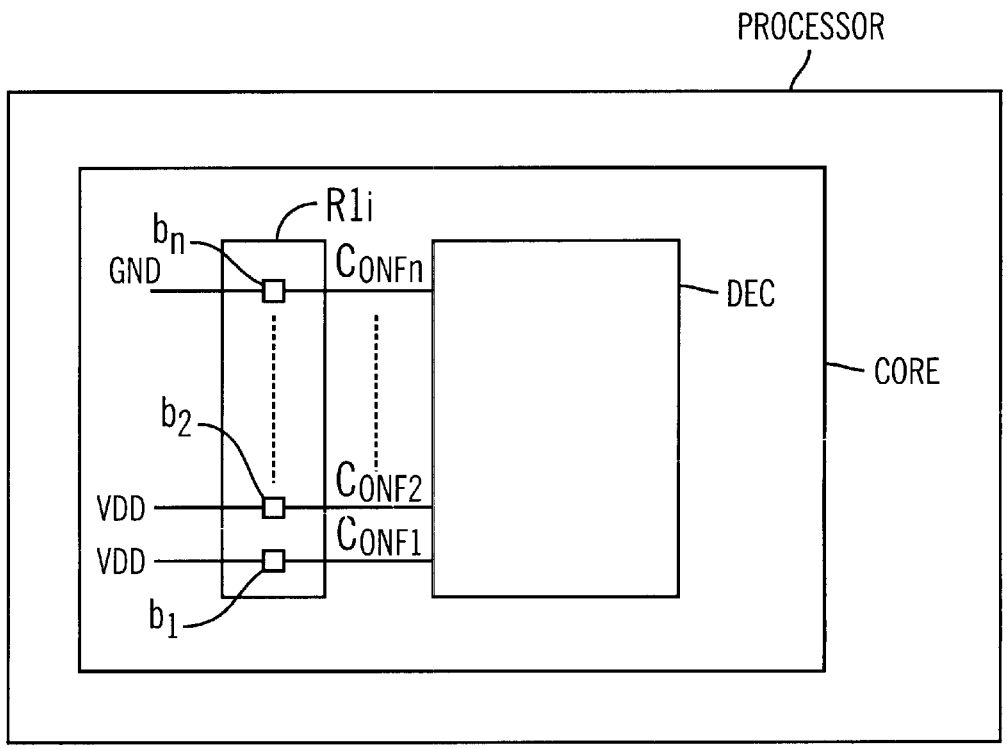
FIG. 2 is a block diagram of a processor having another conventional core configuration.
Figure 3:
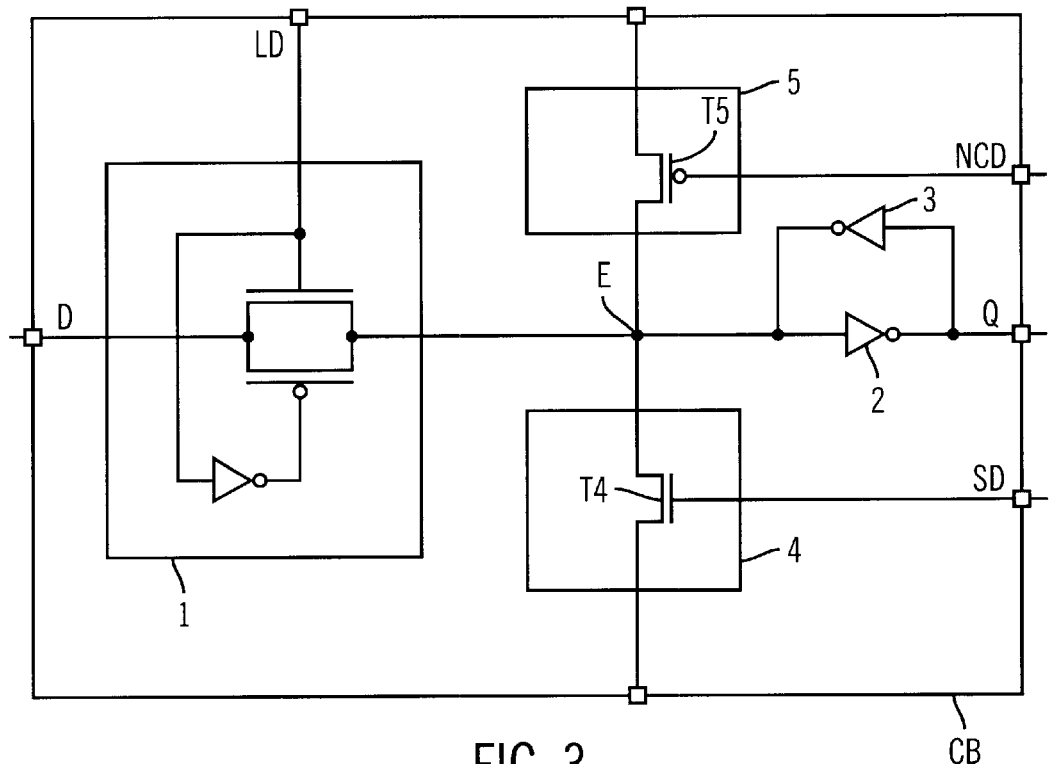
FIG. 3 is a diagram of a basic cell used in processor core configuration.

FIG. 3 shows a drawing of a basic cell for use in a processor core. The basic cell CB is a standard D latch having an input stage 1, two inverters 2 and 3 looped between an internal node E and an output Q, a direct setting command circuit 4, and a direct resetting command circuit 5. The input stage 1 makes it possible to set the internal node E, and therefore the output Q, at the binary level 0 or 1 of the data input D of the latch upon the activation of a load command LD (typically a 1 state). In the example shown, the input stage includes a transfer gate with parallel-connected N and P-type MOS transistors.

The direct setting command circuit 4 includes a transistor T4, in the example an N-type MOS transistor, that is connected between the internal node E and ground GND, and controlled at its gate by a setting signal SD. A level 0 of this signal sets the node E to 0, and therefore the output Q to 1. The direct resetting command circuit 5 includes a transistor T5, in the example a P-type MOS transistor, that is connected between the internal node E and the logic voltage VDD, and controlled at its gate by a resetting signal NCD. A level 0 of this signal sets the node E to 1, and therefore the output Q to 0.

Figure 4:
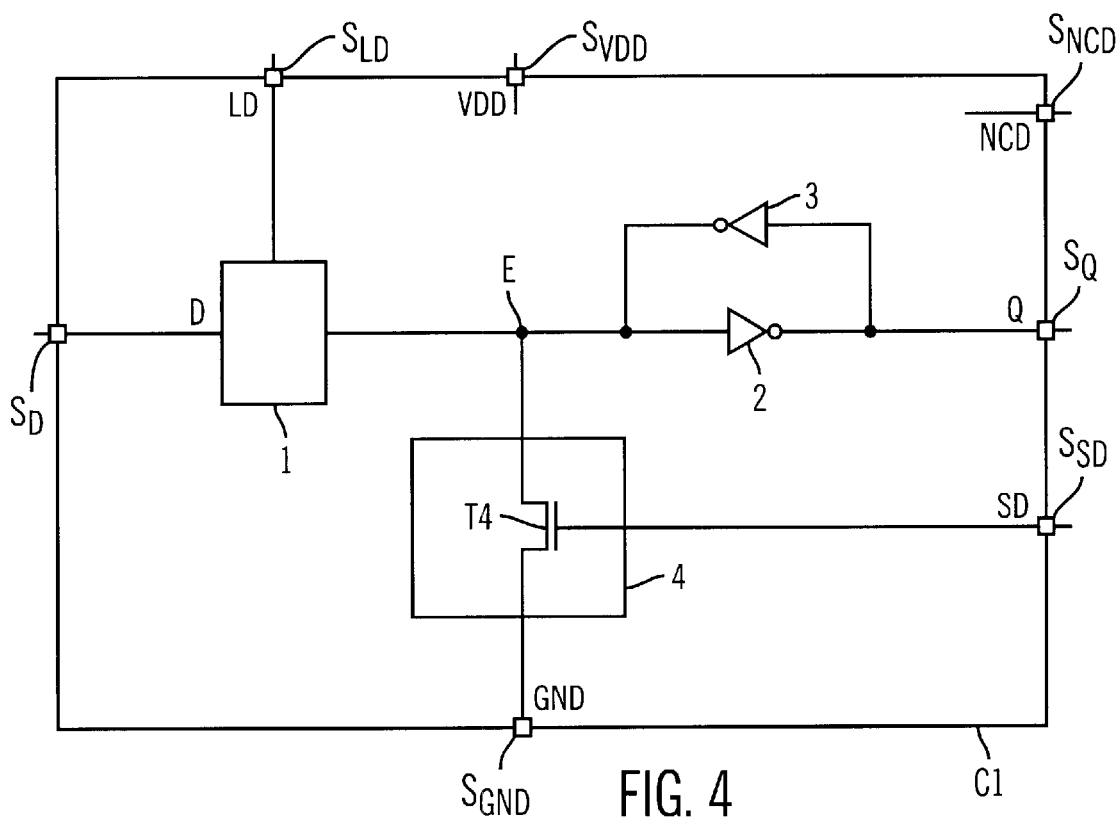
FIG. 4 is a diagram of a cell configured at 1 according to the configuration method of a preferred embodiment of the present invention.
Figure 5:
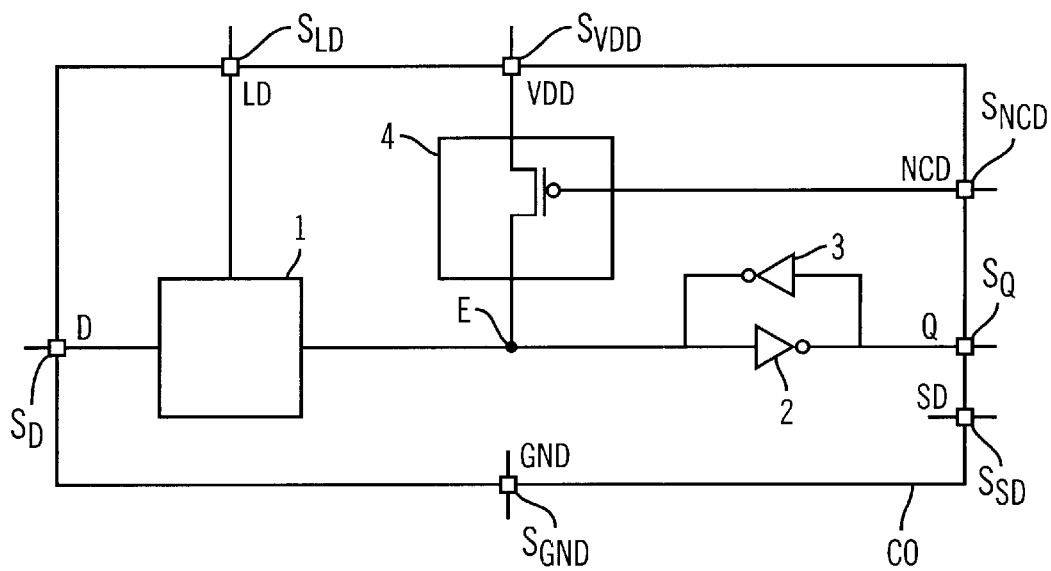
FIG. 5 is a diagram of a cell configured at 0 according to the configuration method of the preferred embodiment.

In accordance with. the preferred embodiment of the present invention, this basic cell CB is used to configure the processor core. In particular, the configuration at 1 or 0 is respectively obtained by inhibiting the direct resetting command or the direct setting command in the basic cell CB. A diagram of the resulting cell C1 when configured at 1 is shown in FIG. 4. In this illustrative embodiment, transistor T5 is simply eliminated. Similarly, a diagram of the resulting cell C0 when configured at 0 is shown in FIG. 5. In this illustrative embodiment, transistor T4 is simply eliminated.

Figure 6:
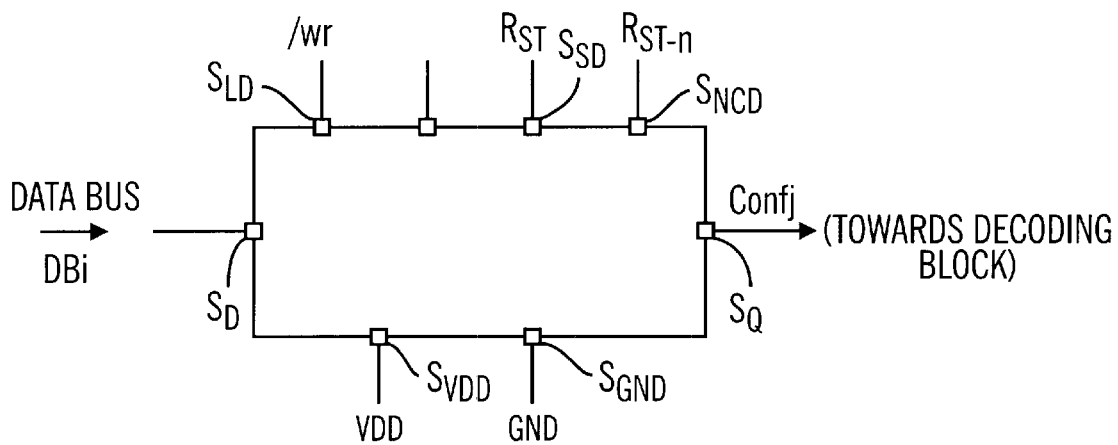
FIG. 6 is a diagram of a vacant cell according to the configuration method of the preferred embodiment.

The abstract of the cell C0 configured at 0 and the abstract of the cell C1 configured at 1 are the same. This abstract defines the space requirement of the cell and its input and output pins. It enables the design tool to reserve the place needed for the cell in the layout diagram of the core and to place the different input and output pins. This abstract is shown in FIG. 6. For both configured cell C1 and configured cell C0, this abstract reserves a place (a rectangle) that is identical and determines the location of the input and output pins of the cell on the periphery of this cell (of the rectangle). Namely, input pins $S_D$, $S_{LD}$, $S_{SD}$, $S_{NCD}$, $S_{VDD}$, and $S_{GND}$ correspond to the signals D, LD, SD, NCD, and to the supply signals, and the output pin $S_Q$ corresponds to the signal Q.

This enables the routing of the external signals up to the periphery of each cell in the layout diagram of the core. In the illustrated embodiment, the input pin $S_D$ is connected to a line of the data bus, pin $S_{LD}$ is connected to a write signal/wr of the register that contains the cell, pin $S_{SD}$ is connected to a resetting signal Rst that is active at 1, pin $S_{NCD}$ is connected to another resetting signal Rst-n that is active at 0, and sites $S_{VDD}$ and $S_{GND}$ are respectively connected to the logic supply voltage VDD and ground GND. The output pin $S_Q$ is connected to a configuration signal Confj that is supplied to the input of the decoding block. Thus, for each cell, whether it is a configured cell C1 or a configured cell C0, there is the same routing of the input and output pins in the layout diagram of the core.

The two resetting signals Rst and Rst-n are generated in a known manner by a circuit for detecting a power-on operation of the circuit of the processor (i.e., the presence of VDD), and the write signal/wr is generated by a control block (not shown) of the core that manages access to the registers. In practice, this write signal can only be activated in test mode. Thus, in the test mode, these registers can be loaded at any value. It is therefore possible to completely test the programmed core with all possible configurations according to a mode of write access to the register that is standard but only available in test mode. Outside of the test mode, the value taken by each cell once the processor is powered on and reset is the value set by the only command available. That is, one for configured cells C1 and zero for configured cells C0. The configuration registers contained in the core are therefore configured definitively.

Figure 7:
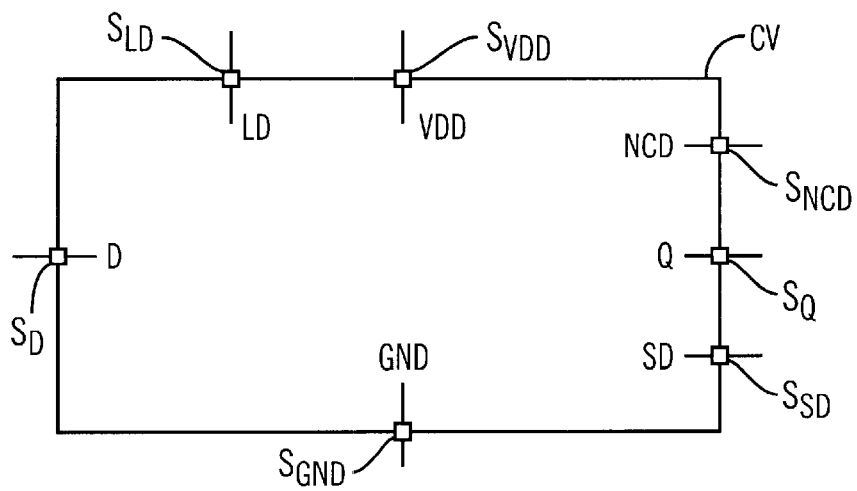
FIG. 7 is an abstract common to the cells configured at 1 and 0 and to the vacant cells in accordance with the preferred embodiment.

Furthermore, the use of such cells in the configuration register makes it possible to use particularly advantageous methods for designing the processor core. According to one embodiment of the present invention, the processor core design method uses a third cell CV that has the same abstract as the cells configured at 1 and 0, but that is vacant. The vacant cell CV is similar to the cell of FIG. 3, but contains no transistors. More specifically, the abstract of the vacant cell is also given by the diagram of FIG. 6. However, the diagram of the vacant cell is shown in FIG. 7. As shown, the vacant cell CV has only the input and output pins D, LD, SD, NCD, VDD, GND, and Q, with the layout diagram (not shown) of the cell having only these pins and levels of metal.

In accordance with preferred embodiments of the present invention, it is possible to design a layout diagram of a non-programmed processor core with a computer-assisted design tool. The non-programmed processor core has a vacant cell for each configuration bit, and signals are routed up to the periphery of this cell on the input and output pins defined for this vacant cell by its abstract diagram. Thus, a non-programmed core is obtained. Then, in a programming step corresponding to the making of a programmed core for a new application, the design method involves instantiating the non-programmed core, instantiating a programming block that has a corresponding configured cell for each bit to be configured, and superimposing each of these configured cells on the location of a corresponding vacant cell in the core. Thus, an application-specific programmed core is obtained.

Figure 8:
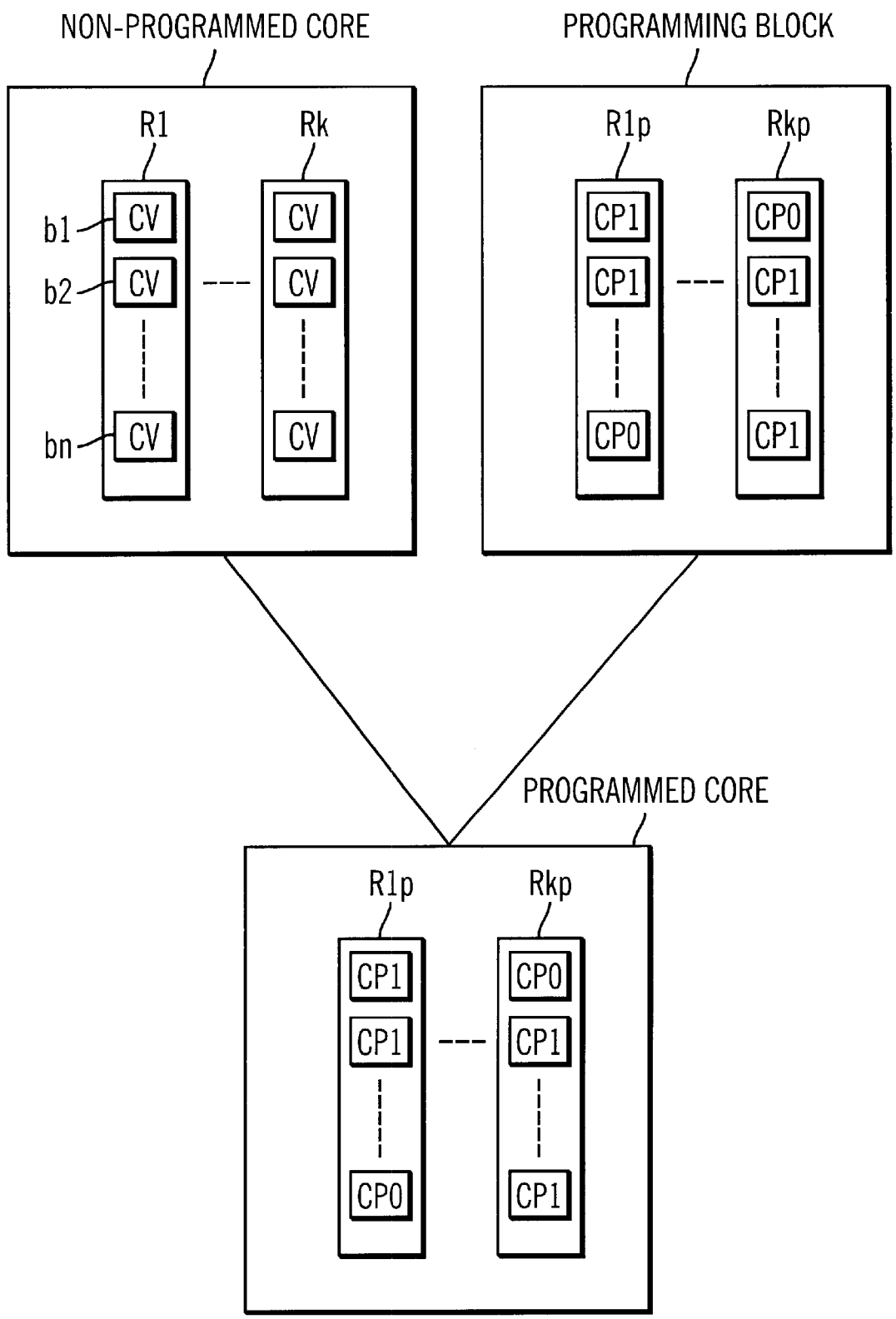
FIG. 8 is a block diagram of a method for designing a processor core in accordance with one embodiment of the present invention.

FIG. 8 shows a block diagram of this preferred design method. As shown, the non-programmed core illustratively includes k registers R1 to Rk that each have n bits b1 to bn. For each of these bits, a vacant cell CV is provided. The corresponding layout diagram is complete except for the locations of these vacant cells, but all of the routing of signals is done up to the input and output pins of the vacant cells. Additionally, a programming block for a specific application includes k registers R1$p$ to Rk$p$ having a programmed cell (C1 or C0) for each bit b1 to bn of the registers. The proper programmed cell is chosen according to the specifications of the specific application.

In the programmed core, each of the configured cells fills the location of the corresponding vacant cell CV in the non-programmed core. For a given application, it is possible to have only x<k resources used. For this purpose, it is planned in practice that one of the bits of the configuration register (typically one of the bits corresponding to the access mode) will be an enabling bit that activate or deactivates the decoding downstream by the decoding block. Thus, if in an application few resources are used, this enabling bit can be used to disable the decoding (typically by placing it at 0) of the unused configuration registers. The other bits of these registers are then configured at 1 or 0 without distinction.

The design method of the present invention can be applied in a similar way for the core of a corresponding emulator. In this case, cells configured without distinction at 1 or 0 are used, and the writing of these cells is permitted not only in testing but also in operation.

Accordingly, the design method of the present invention enables the defining of a single core that is non-programmed. For each new application of the processor to be made, or for the making of an emulator, it is enough to make a corresponding programming block and to apply it to the non-programmed core to obtain a core that is programmed for the application considered. Thus, design time is reduced because it is not necessary to carry out the entire designing of the core. At that time, the starting point is a layout diagram in which there are only vacant locations corresponding to vacant cells to be filled. Therefore, the present invention provides a method of computed-assisted design that enables production of the corresponding manufacturing diagrams (layout diagram, masks, and the like) for a circuit.

While there has been illustrated and described what are presently considered to be the preferred embodiments of the present invention, it will be understood by those skilled in the art that various other modifications may be made, and equivalents may be substituted, without departing from the true scope of the present invention. Additionally, many modifications may be made to adapt a particular situation to the teachings of the present invention without departing from the central inventive concept described herein. Furthermore, an embodiment of the present invention may not include all of the features described above. Therefore, it is intended that the present invention not be limited to the particular embodiments disclosed, but that the invention include all embodiments falling within the scope of the appended claims.

What is claimed is:

1. A method for designing a processor core having a normal operating mode and a test mode, said method comprising the steps of:

programing configuration registers of the processor core by providing a cell that is definitively configured at either one or zero in the normal operating mode for each bit of the configuration registers, each cell being a latch with control signal inputs for receiving a direct resetting command and a direct setting command, each cell being definitively configured at either one or zero in the normal operating mode by inhibiting either the direct resetting command or the direct setting command; and providing the latch of each configured cell with a data input such that data can be written into the cells only in the test mode, wherein both the cells definitely configured at one in the normal operating mode and the cells definitely configured at zero in the normal operating mode have the same abstract defining their space requirements and input and output pins.

2. A method for designing and programming a processor core of the type having configuration registers, said method comprising the steps of:

designing a non-programmed processor core by providing one vacant cell for each bit of the configuration registers, the vacant cell having the same abstract as both cells configured at one and cells configured at zero; and programming the processor core by;
   instantiating the non-programmed core;
   instantiating a programming block having a cell configured at either one or zero for each bit of the configuration registers; and
   superimposing each of the configured cells of the programming block on the location of a corresponding vacant cell in the non-programmed core,
wherein both the cells configured at one and the cells configured at zero have the same abstract defining their space requirements and input and output pins.

3. The method as defined in claim 2,
wherein each configured cell is a latch with a data input and control signal inputs for receiving a direct resetting command and a direct setting command, and
each cell is definitely configured at either one or zero in a normal operating mode by inhibiting either the direct resetting command or the direct setting command.

4. The method as defined in claim 3, further comprising the step of permitting data to be written into the cells of the configuration registers only in a test mode.

5. The method as defined in claim 2, further comprising the step of permitting data to be written into the cells of the configuration registers only in a test mode.

6. The method as defined in claim 2, further comprising the step of designing the vacant cell having the same abstract as both the cells configured at one and the cells configured at zero.

7. The method as defined in claim 2, wherein the abstract defines space requirements and input and output pins.

8. A machine-readable medium encoded with a program for designing a processor core having a normal operating mode and a test mode, said program containing instructions for performing the steps of:
   programming configuration registers of the processor core by providing a cell that is definitively configured at either one or zero in the normal operating mode for each bit of the configuration registers, each cell being a latch with control signal inputs for receiving a direct resetting command and a direct setting command, each cell being definitively configured at either one or zero in the normal operating mode by inhibiting either the direct resetting command or the direct setting command; and
   providing the latch of each configured cell with a data input such that data can be written into the cells only in the test mode,
   wherein both the cells definitely configured at one in the normal operating mode and the cells definitely configured at zero in the normal operating mode have the same abstract defining their space requirements and input and output pins.

9. A machine-readable medium encoded with a program for designing and programming a processor core of the type having configuration registers, said program containing instructions for performing the steps of:
   designing a non-programmed processor core by providing one vacant cell for each bit of the configuration registers, the vacant cell having the same abstract as both cells configured at one and cells configured at zero; and
   programming the processor core by:
      instantiating the non-programmed core;
      instantiating a programming block having a cell configured at either one or zero for each bit of the configuration registers; and
      superimposing each of the configured cells of the programming block on the location of a corresponding vacant cell in the non-programmed core,
   wherein both the cells configured at one and the cells configured at zero have the same abstract defining their space requirements and input and output pins.

10. The machine-readable medium as defined in claim 9,
wherein each configured cell is a latch with a data input and control signal inputs for receiving a direct resetting command and a direct setting command, and
each cell is definitely configured at either one or zero in a normal operating mode by inhibiting either the direct resetting command or the direct setting command.

11. The machine-readable medium as defined in claim 10, wherein said program further contains instructions for performing the step of permitting data to be written into the cells of the configuration registers only in a test mode.

12. The machine-readable medium as defined in claim 9, wherein said program further contains instructions for performing the step of permitting data to be written into the cells of the configuration registers only in a test mode.

13. The machine-readable medium as defined in claim 9, wherein said program further contains instructions for performing the step of designing the vacant cell having the same abstract as both the cells configured at one and the cells configured at zero.

14. The machine-readable medium as defined in claim 9, wherein the abstract defines space requirements and input and output pins.

* * * * *